(12) United States Patent
Han et al.

(10) Patent No.: US 12,391,849 B2
(45) Date of Patent: Aug. 19, 2025

(54) ENCAPSULATION FILM

(71) Applicant: LG CHEM, LTD, Seoul (KR)

(72) Inventors: Eun Gu Han, Daejeon (KR); So Young Kim, Daejeon (KR); Seung Min Lee, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 906 days.

(21) Appl. No.: 17/434,665

(22) PCT Filed: Feb. 28, 2020

(86) PCT No.: PCT/KR2020/002899
§ 371 (c)(1),
(2) Date: Aug. 27, 2021

(87) PCT Pub. No.: WO2020/175958
PCT Pub. Date: Sep. 3, 2020

(65) Prior Publication Data
US 2022/0154054 A1  May 19, 2022

(30) Foreign Application Priority Data

Feb. 28, 2019 (KR) .................. 10-2019-0024260

(51) Int. Cl.
*C09J 7/10* (2018.01)
*C09J 7/30* (2018.01)
(Continued)

(52) U.S. Cl.
CPC . *C09J 7/10* (2018.01); *C09J 7/30* (2018.01); *C09J 11/06* (2013.01); *C09J 153/00* (2013.01);
(Continued)

(58) Field of Classification Search
CPC ............ C09J 153/00; C09J 7/30; C09J 11/06; C09J 2203/326; C09J 2301/208; C09J 2453/00;
(Continued)

(56) References Cited

U.S. PATENT DOCUMENTS

2015/0357570 A1* 12/2015 Lee .................. C08L 33/08
524/518
2017/0044405 A1* 2/2017 Yoo .................. B32B 37/1207
(Continued)

FOREIGN PATENT DOCUMENTS

CN      107849414 A    3/2018
JP      2005129520 A   5/2005
(Continued)

OTHER PUBLICATIONS

Bae et al., machine English translation of WO2019/124934 (Year: 2019).*

*Primary Examiner* — Jessica M Roswell
(74) *Attorney, Agent, or Firm* — Bryan Cave Leighton Paisner LLP

(57) ABSTRACT

The present disclosure relates to an encapsulation film and an organic electronic device comprising the same, which provides an encapsulation film having excellent resilience without causing plastic deformation, while having flexible and rollable characteristics, as well as implementing excellent moisture barrier characteristics, and an organic electronic device comprising the same. The encapsulation film includes an encapsulation composition which includes a block copolymer having a first block derived from a monomer having a glass transition temperature of 0° C. or higher, and a multifunctional oligomer, where, after the encapsulation film is stretched 200% (2 times the existing length) in the longitudinal direction under conditions of a temperature of 25° C. and 60% relative humidity and left for 24 hours, the degree of restoration at the time of removing the (Continued)

stretched force and measuring the length after 1 hour is within 110% of the existing length.

19 Claims, 1 Drawing Sheet

(51) Int. Cl.
    *C09J 11/06*     (2006.01)
    *C09J 153/00*     (2006.01)
    *H10K 50/84*     (2023.01)
    *H10K 50/844*     (2023.01)
    *H10K 71/00*     (2023.01)
    *H10K 85/10*     (2023.01)

(52) U.S. Cl.
    CPC ........... *H10K 50/844* (2023.02); *H10K 71/00* (2023.02); *H10K 85/111* (2023.02); *H10K 85/151* (2023.02); *C09J 2203/326* (2013.01); *C09J 2301/208* (2020.08); *C09J 2453/00* (2013.01); *H10K 50/846* (2023.02)

(58) Field of Classification Search
    CPC ........ C09J 2433/00; C09J 7/10; C09J 201/02; C09J 7/00; C08F 287/00; C08F 290/067; C09D 151/08; C09D 153/02; G09F 9/30; G09F 9/301; H10K 50/844; H10K 50/846; H10K 71/00; H10K 85/111; H10K 85/151; H10K 50/84; H10K 2102/311

See application file for complete search history.

(56) References Cited

U.S. PATENT DOCUMENTS

| | | | |
|---|---|---|---|
| 2018/0171181 | A1 | 6/2018 | Bae et al. |
| 2018/0171188 | A1 | 6/2018 | Bae et al. |
| 2019/0077120 | A1 | 3/2019 | Kim et al. |

FOREIGN PATENT DOCUMENTS

| | | | |
|---|---|---|---|
| JP | 2005306946 | A | 11/2005 |
| JP | 2009-096839 | A | 5/2009 |
| JP | 2013-054516 | A | 3/2013 |
| JP | 2018-508622 | A | 3/2018 |
| JP | 2018-113137 | A | 7/2018 |
| KR | 10-2004-0006017 | A | 1/2004 |
| KR | 10-2006-0090692 | A | 8/2006 |
| KR | 10-2017-0106245 | A | 9/2017 |
| KR | 10-1822254 | B1 | 1/2018 |
| KR | 10-2018-0040509 | A | 4/2018 |
| KR | 10-1924144 | B1 | 11/2018 |
| TW | 201801910 | A | 1/2018 |
| WO | 2016025965 | A1 | 2/2016 |
| WO | 2016124744 | A1 | 8/2016 |
| WO | 2017154995 | A1 | 9/2017 |

\* cited by examiner

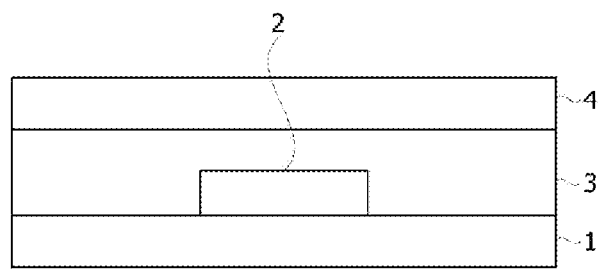

ENCAPSULATION FILM

CROSS-REFERENCE TO RELATED APPLICATIONS

This application is a National Phase entry pursuant to 35 U.S.C. § 371 of International Application No. PCT/KR2020/002899, filed Feb. 28, 2020, and claims the benefit of and priority to Korean Patent Application No. 10-2019-0024260 filed on Feb. 28, 2019, the disclosures of which are hereby incorporated by reference in their entirety for all purposes as if fully set forth herein.

TECHNICAL FIELD

The present application relates to an encapsulation film, an organic electronic device comprising the same, and an organic electronic device comprising the same.

BACKGROUND ART

An organic electronic device (OED) means a device comprising an organic material layer that generates alternate current of charges using holes and electrons. An example of the organic electronic device may include a photovoltaic device, a rectifier, a transmitter and an organic light emitting diode (OLED), and the like.

In one embodiment, the organic light emitting diode (OLED) has less power consumption and faster response speed than existing light sources, and is advantageous for thinning of a display device or illumination. The OLED has also spatial usability and thus is expected to be applied in various fields covering various portable devices, monitors, notebooks, and TVs.

Recently, flexible and rollable products have been more important in the display field. Also, commercialization and application expansion of the OLED, the most important problem is a durability problem. The organic materials and the metal electrodes, and the like included in the OLED are easily oxidized by external factors such as moisture. Accordingly, in a recent study, a display having excellent resilience without causing plastic deformation even when certain deformation and simultaneously excellent moisture barrier performance is under discussion.

DISCLOSURE

Technical Problem

The present application provides an encapsulation film having excellent resilience without causing plastic deformation, while having flexible and rollable characteristics, as well as implementing excellent moisture barrier characteristics, and an organic electronic device comprising the same.

Technical Solution

Hereinafter, embodiments of the present invention will be described in more detail with reference to the accompanying drawings. In explaining the present invention, a detailed description of known common functions and configurations incorporated herein is also omitted. The accompanying drawings are schematically shown to help understanding the present invention, where parts not related to the description have been omitted to more clearly explain the present invention. In the drawings, the thickness or size has been shown in an enlarged scale to clearly indicate several layers and regions. The scope of the present invention is not limited by the thickness, size, ratio, etc. shown in the drawings.

The present application relates to an encapsulation film. The encapsulation film can be applied to an organic electronic device, and in one example, it can be applied to an organic electronic device having flexible and rollable characteristics. For example, the encapsulation film can protect an organic electronic element from moisture or oxygen by sealing the entire surface of the organic electronic element in the organic electronic device in a cured or uncured form of an adhesive film or a pressure-sensitive adhesive film. After the encapsulation film according to the present application is applied to the organic electronic device, it can effectively suppress cracks capable of occurring in the organic electronic device, despite several folding or rolling processes, and have physical properties having excellent resilience after rolling, while alleviating stress caused by folding.

In this specification, the term "organic electronic device" means an article or device having an element comprising an organic material layer that generates alternate current of charges using holes and electrons between a pair of electrodes facing each other, and an example thereof can include, but is not limited to, a photovoltaic device, a rectifier, a transmitter and an organic light emitting diode (OLED), and the like. In one example of the present invention, the organic electronic device can be an OLED.

In this specification, the term adhesive is a term encompassing not only a material commonly referred to as an adhesive but also a layer formed using a material referred to as a so-called pressure-sensitive adhesive or a material referred to as a adhesive and pressure-sensitive adhesive.

The encapsulation film according to the present application comprises a block copolymer and a multifunctional oligomer. The block copolymer can have a first block derived from a monomer having a glass transition temperature of 0° C. or higher. In addition, after the encapsulation film is stretched 200% (2 times the original length) in the longitudinal direction under conditions of a temperature of 25° C. and 60% relative humidity and left for 24 hours, the degree of restoration at the time of removing the stretched force and measuring the length after 1 hour can be within 110% of the original length. Here, the longitudinal direction can mean the direction of any one side in the polygonal shaped encapsulation film, and in an embodiment, it can mean the direction of a long side. The degree of restoration can be, for example, 109% or less, 108% or less, 107% or less, 106% or less, 105% or less, 104% or less, or 103% or less, and the lower limit is not particularly limited, which can be 98% or more, 100% or more, 101% or more, or 102% or more. The present application can have physical properties having excellent resilience even after rolling while alleviating stress caused by folding by being applied to a flexible organic electronic device by adjusting the degree of restoration of the encapsulation film.

The encapsulation film can comprise an encapsulation layer, as described below, where an encapsulation composition constituting the encapsulation layer can have the following composition. In one example, the encapsulation film can comprise the block copolymer and the multifunctional oligomer in ratios of 30 to 90 parts by weight and 5 to 48 parts by weight; 35 to 85 parts by weight and 10 to 45 parts by weight; 42 to 80 parts by weight and 15 to 40 parts by weight or 47 to 70 parts by weight and 20 to 38 parts by weight, respectively.

Existing olefin-based resins have a property of a low water vapor transmission rate and low elasticity of the cured products, whereby a large amount of a moisture adsorbent to be described below can be included, and thus have very excellent moisture barrier properties, but lack resilience, thereby having a disadvantage that it is difficult to restore to their original state after deformation. However, when a resin having high elasticity after curing is used as a resin component in order to increase resilience, they have a problem that the moisture barrier properties are lowered. As the above-mentioned encapsulation film is applied to the organic electronic device, the present application can realize excellent resilience and endurance reliability in harsh conditions despite folding or rolling, while blocking moisture or oxygen flowing from the outside.

When the monomer has been polymerized into a homopolymer, the glass transition temperature of the monomer defined in this specification can be the glass transition temperature of the polymer. That is, when the monomer has formed a homopolymer, the monomer having a glass transition temperature of 0° C. or higher constituting the first block in the block copolymer can be the monomer that the polymer has a glass transition temperature of 0° C. or higher.

In an embodiment of the present application, the block copolymer can further comprise a second block, where the second block can have a lower glass transition temperature than that of the first block. In one example, the second block can be derived from a monomer having a glass transition temperature of less than 0° C., −10° C. or lower, −30° C. or lower, or −50° C. or lower. The lower limit of the glass transition temperature of the monomer is not particularly limited, which can be −300° C. In addition, the monomer constituting the first block can have a glass transition temperature of 0° C. or higher, 50° C. or higher, 70° C. or higher, or 90° C. or higher. The upper limit of the glass transition temperature of the first block monomer can be 300° C. By adjusting the glass transition temperature of each block in the block copolymer, the present application can realize excellent resilience in folding or rolling simultaneously with moisture barrier properties.

In the present application, the term "block derived from a monomer" can mean that a polymerized unit in a block of a copolymer is formed from a polymerization reaction of the monomer.

In one example, the monomer constituting the block copolymer can include, for example, an olefin-based monomer. That is, at least one of the first block and the second block can include an olefin-based monomer. The olefin-based monomer can include, for example, ethylene, propylene, 1-butene, 2-butene, isobutylene, isoprene, styrene or butadiene. In one embodiment, the olefin-based compound can be a diene compound.

As long as the monomer constituting the first block and the monomer constituting the second block each satisfy the above-described glass transition temperature, their kinds are not particularly limited. The monomer constituting the first block or the second block can be, for example, a monomer having 2 to 12, 3 to 10, or 3 to 8 carbon atoms. Also, the monomer constituting the first block or the second block can have 1 or 2 to 3 unsaturated hydrocarbon bonds. The monomer constituting the second block can have a cyclic structure in the molecular structure. In addition, the monomer constituting the second block can have an unsaturated group in the molecular structure even after polymerization, and can also have an aromatic group in the molecular structure.

Depending on the type of the monomer, the block copolymer according to the present application can comprise at least one or more unsaturated groups in the molecular structure. That is, the monomer can comprise one or more unsaturated groups in addition to the polymerized unit. However, after curing the encapsulation film, some or all of the unsaturated groups can be crosslinked with a multifunctional oligomer or a reactive monomer.

By using the above block copolymer, the present application can maintain physical properties such as processability, a crosslinking degree and restoration performance, thereby ensuring durability of the film itself when applied to an organic electronic device.

In the present application, the block copolymer can have a weight average molecular weight (MW) such that the encapsulation composition can be molded into a film shape. For example, the polymer can have a weight average molecular weight of 10,000 g/mol to 2,000,000 g/mol, 20,000 to 1,500,000 g/mol, 30,000 to 1,000,000 g/mol, 40,000 to 80,000 g/mol, 50,000 to 500,000 g/mol, 80,000 to 300,000 g/mol or 90,000 to 200,000 g/mol or so. In the present application, the term weight average molecular weight means a conversion value for standard polystyrene measured by GPC (gel permeation chromatograph).

As described above, the encapsulation film of the present application can comprise a multifunctional oligomer. The multifunctional oligomer can be a curable oligomer, where the oligomer can be a thermosetting or photocurable oligomer.

In one example, the multifunctional oligomer can be a compound containing two or more active energy ray polymerizable functional groups. The number of the functional groups is not particularly limited, but can be in a range of 2 to 8. Also, unlike the monomers described below, the multifunctional oligomer can have a weight average molecular weight in the range of 500 g/mol to 50,000 g/mol. The lower limit of the weight average molecular weight of the multifunctional oligomer can be 800 g/mol, 1000 g/mol, 1200 g/mol, 1500 g/mol, 2000 g/mol or 3000 g/mol. In addition, the upper limit of the weight average molecular weight of the multifunctional oligomer can be 40,000 g/mol, 35,000 g/mol, 25,000 g/mol, 15,000 g/mol, 10,000 g/mol or 9,000 g/mol. The multifunctional oligomer can be an acrylic compound or a vinyl compound, but is not limited thereto. The present application comprises the multifunctional oligomer with the above-mentioned block copolymer in a specific content, thereby realizing excellent restoration characteristics and endurance reliability in harsh conditions.

In one example, the encapsulation film can further comprise a reactive monomer. The reactive monomer can be a photocurable or thermosetting monomer. An exemplary reactive monomer can have a weight average molecular weight in a range of less than 500 g/mol, less than 400 g/mol, 50 to 390 g/mol or 100 to 350 g/mol.

In one example, the reactive monomer can comprise one or two or more functional groups, and can comprise 8 or less reactive functional groups, the upper limit of which is not particularly limited. In one example, the reactive monomer can comprise one or more active energy ray polymerizable functional groups. That is, the reactive monomer can be a monofunctional compound or a multifunctional compound. Furthermore, the reactive monomer can be an acrylic compound or a vinyl compound.

In an embodiment of the present application, when the encapsulation film comprises a reactive monomer, the block copolymer, the multifunctional oligomer and the reactive monomer can be included in amounts of 30 to 90 parts by weight, 5 to 48 parts by weight and 1 to 40 parts by weight; 35 to 85 parts by weight, 10 to 45 parts by weight and 2 to 38 parts by weight; 42 to 80 parts by weight, 15 to 40 parts by weight and 3 to 33 parts by weight; or 47 to 70 parts by weight, 20 to 38 parts by weight and 4 to 28 parts by weight, respectively.

In one example, when it is based on 100 parts by weight of the block copolymer, the multifunctional oligomer can be included, in the encapsulation film, in a range of 20 to 95 parts by weight, 30 to 93 parts by weight, 35 to 90 parts by weight, 40 to 85 parts by weight, 43 to 83 parts by weight, 48 to 70 parts by weight, 49 to 60 parts by weight, 53 to 60 parts by weight or 49 to 55 parts by weight, relative to 100 parts by weight of the block copolymer. Also, the reactive monomer can be included in a range of 3 to 70 parts by weight, 4 to 65 parts by weight, 5 to 60 parts by weight, 6 to 58 parts by weight, 7 to 53 parts by weight, 10 to 52 parts by weight, 13 to 48 parts by weight, 15 to 32 parts by weight, 20 to 55 parts by weight or 5 to 16 parts by weight, relative to 100 parts by weight of the block copolymer. In addition, the block copolymer can be included in a range of 25 wt % to 90 wt %, 28 wt % to 80 wt %, 30 wt % to 75 wt %, 35 wt % to 70 wt %, 40 wt % to 68 wt %, 45 wt % to 65 wt %, 55 wt % to 63 wt % or 45 wt % to 55 wt % of the entire encapsulation composition constituting the encapsulation film. By adjusting the content ratios of the respective compositions, the present application realizes an appropriate range of crosslinking degree, while having moisture barrier properties, to have the desired elasticity, whereby it is possible to realize endurance reliability in harsh conditions with resilience after deformation.

In one example, if necessary, the encapsulation film can further comprise a tackifier, where the tackifier can be a hydrogenated cyclic olefin-based polymer. As the tackifier, for example, a hydrogenated petroleum resin obtained by hydrogenating a petroleum resin can be used. The hydrogenated petroleum resin can be partially or fully hydrogenated and can be also a mixture of such resins. Such a tackifier can be selected to have good compatibility with the encapsulation composition, excellent moisture barrier property, and low organic volatile components. A specific example of the hydrogenated petroleum resin can include a hydrogenated terpene resin, a hydrogenated ester resin or a hydrogenated dicyclopentadiene resin, and the like. The tackifier can have a weight average molecular weight of about 200 to 5,000 g/mol. The content of the tackifier can be appropriately adjusted as necessary. For example, the content of the tackifier can be included in a ratio of 5 parts by weight to 100 parts by weight or 20 to 40 parts by weight relative to 100 parts by weight of the solid content of the encapsulation composition.

In an embodiment of the present application, the encapsulation composition can further comprise a curing agent or an initiator depending on the type of the block copolymer, multifunctional oligomer or reactive monomer. For example, it can further comprise a curing agent capable of forming a crosslinked structure or the like, or a cationic initiator or a radical initiator capable of initiating a curing reaction, by reacting it with the aforementioned block copolymer, multifunctional oligomer or reactive monomer. As the cationic initiator, a cationic photopolymerization initiator or a cationic thermal initiator can be used.

In one example, as the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, the initiator can be included in an amount of 0.01 parts by weight to 20 parts by weight, 0.04 parts by weight to 10 parts by weight, or 0.1 parts by weight to 5 parts by weight relative to 100 parts by weight of the solid content of the encapsulation composition.

The encapsulation film of the present application can comprise a moisture adsorbent, if necessary. The term "moisture adsorbent" can be used in a meaning to collectively call a component capable of adsorbing or removing moisture or humidity introduced from the outside through a physical or chemical reaction or the like. That is, it means a chemically reactive adsorbent or a physical adsorbent, where mixtures thereof can also be used.

The chemically reactive adsorbent chemically reacts with moisture, humidity or oxygen, and the like introduced into the adhesive to adsorb the moisture or humidity. The physical adsorbent can lengthen migration paths of moisture or humidity that penetrates into the encapsulation structure to suppress the penetration of the moisture or humidity, and maximize the barrier properties against moisture and humidity through interaction with the matrix structure of the adhesive resin and the moisture-reactive adsorbent.

A specific kind of the usable moisture adsorbent in the present application is not particularly limited, which can include, for example, one or a mixture of two or more of metal powder such as alumina, a metal oxide such as alumina, a metal salt or phosphorus pentoxide ($P_2O_5$), and the like, in the case of a chemically reactive adsorbent, and can include zeolite, titania, zirconia or montmorillonite, and the like, in the case of the physical adsorbent.

Here, a specific example of the metal oxide can include alumina, lithium oxide ($Li_2O$), sodium oxide ($Na_2O$), barium oxide (BaO), calcium oxide (CaO) or magnesium oxide (MgO), and the like, and an example of the metal salt can include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto.

In the present application, a moisture adsorbent such as the metal oxide can be blended into the composition in a properly processed state. For example, the adhesive, in which the above-described encapsulation composition is prepared in a film form, can be formed into a thin film having a thickness of 100 μm or less, 80 μm or less, 50 μm or less, or 30 μm or less depending on the type of the organic electronic device to be applied, and in this case, a grinding process of the moisture adsorbent can be required. A process such as a three-roll mill, a bead mill or a ball mill can be used for grinding the moisture adsorbent.

The encapsulation film of the present application can comprise the moisture adsorbent in an amount of 5 parts by weight to 200 parts by weight, 8 to 190 parts by weight, 10 parts by weight to 180 parts by weight, 20 to 150 parts by weight, 50 to 130 parts by weight, 60 to 100 parts by weight or 70 to 90 parts by weight, relative to 100 parts by weight of the block copolymer. The moisture adsorbent may not be included as an optional component, but preferably, by controlling the content of the moisture adsorbent to 5 parts by weight or more, the cured product can exhibit excellent moisture and humidity barrier properties. In addition, by controlling the content of the moisture adsorbent to 200 parts by weight or less, it can exhibit excellent moisture barrier characteristics, while forming the encapsulation structure of the thin film.

In this specification, unless otherwise specified, the unit "parts by weight" means the weight ratio between the respective components.

The encapsulation composition of the present application can comprise a filler, preferably an inorganic filler, if necessary. The filler can increase the moving route of moisture or humidity penetrating into the encapsulation structure to inhibit the penetration thereof, and maximize the barrier property against moisture and humidity through interaction with the matrix structure of the resin component and the moisture adsorbent, and the like. The specific kind of the filler that can be used in the present application is not particularly limited, and for example, one or a mixture of two or more of silica, clay or talc, and the like can be used.

In the present application, in order to improve the bonding efficiency of the filler with an organic binder, a product surface-treated with an organic material can be used as the filler, or a coupling agent can be additionally added thereto and used.

The encapsulation film of the present application can comprise 0 parts by weight to 50 parts by weight, 1 part by weight to 40 parts by weight or 1 part by weight to 20 parts by weight of a filler relative to 100 parts by weight of the block copolymer. In the present application, the filler may not be included in the adhesive as an optional component, but by controlling it to 1 part by weight or more, it is possible to provide an encapsulation structure having excellent moisture or humidity barrier properties and mechanical properties. In addition, in the present application, by controlling the filler content to 50 parts by weight or less, it is possible to manufacture a film form, and even when formed as a thin film, it is possible to provide a cured product exhibiting excellent moisture barrier properties.

Furthermore, in one example, the encapsulation film can further comprise a dispersant so that the moisture adsorbent and the like can be uniformly dispersed. As the usable dispersant here, for example, a nonionic surfactant having affinity with the surface of the moisture adsorbent and having good compatibility with an adhesive resin or the like can be used.

In one example, the encapsulation film can further comprise a silane coupling agent. The silane coupling agent can be, for example, 3-methacryloxypropyl trimethoxysilane, 3-methacryloxypropyl triethoxysilane, 3-acryloxypropyl trimethoxysilane, 3-acryloxypropyl triethoxysilane, 3-methacryloxymethyl triethoxysilane, 3-methacryloxymethyl trimethoxysilane, 3-acryloxypropyl methyldimethoxysilane, methacryloxymethyl methyldimethoxysilane, methacryloxymethyl methyldiethoxysilane, methacryloxypropyl methyldimethoxysilane, methacryloxypropyl methyldiethoxysilane, methacryloxypropyl dimethylmethoxysilane or methacryloxypropyl dimethylethoxysilane. The silane coupling agent can serve to increase interfacial adhesion, when the encapsulation composition is made of a film and applied. The silane coupling agent can be included in an amount of, for example, 0.1 parts by weight to 10 parts by weight, 0.5 to 8 parts by weight, 0.8 parts by weight to 5 parts by weight, 1 part to 5 parts by weight, 1 part by weight to 4.5 parts by weight, or 1 part by weight to 2 parts by weight, relative to 100 parts by weight of the block copolymer.

The encapsulation film according to the present application can comprise, in addition to the above-described configurations, various additives in accordance with uses, the kind of the resin component, and the process for preparing the adhesive layer as described below, within the range not affecting the above-described effects of the invention. For example, the encapsulation film can comprise a coupling agent, a cross-linking agent, a curable material, an ultraviolet stabilizer or an antioxidant, and the like in an appropriate range of content depending on the desired physical properties.

The encapsulation film according to the present application can comprise an encapsulation layer including the above-described encapsulation composition. Here, the encapsulation film can have a single-layered structure or a multi-layered structure of two or more layers. For example, the encapsulation film can comprise an encapsulation layer with a multi-layered structure of two or more layers, where the two or more encapsulation layer compositions can be the same or different, and at least one layer of the multi-layered structure can comprise the above-described encapsulation composition.

The structure of the encapsulation film of the present application is not particularly limited, but as one example, it can have a structure comprising a base film or a release film (hereinafter, sometimes referred to as a "first film"); and the encapsulation layer formed on the base film or release film.

The encapsulation film of the present application can further comprise a base film or a release film (hereinafter, sometimes referred to as a "second film") formed on the encapsulation layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment can be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In addition, the kind of the second film (hereinafter, sometimes referred to as a "cover film") that can be used in the present application is also not particularly limited. For example, in the present application, as the second film, the kind which is same as or different from the first film can be used, within the category illustrated in the first film as described above. Furthermore, in the present application, the second film can also be subjected to the appropriate release treatment and used.

In the present application, the thickness of the base film or release film (first film) as above is not particularly limited, which can be appropriately selected depending on the application to which it is applied. For example, in the present application, the thickness of the first film can be 10 μm to 500 μm, preferably, 20 μm to 200 μm or so. If the thickness is less than 10 μm, deformation of the base film can easily occur during the manufacturing process, whereas if it exceeds 500 μm, the economic efficiency is low.

Furthermore, in the present application, the thickness of the second film is also not particularly limited. In the present application, for example, the thickness of the second film can also be set to be the same as that of the first film. In the present application, the thickness of the second film can also be set to be relatively thin as compared to the first film in consideration of processability and the like.

The thickness of the encapsulation layer included in the encapsulation film of the present application is not particularly limited, which can be appropriately selected in accordance with the following conditions in consideration of the application to which the film is applied. The thickness of the encapsulation layer included in the encapsulation film of the present application can be about 5 μm to 200 μm, preferably, about 10 μm to 150 μm or so.

Meanwhile, the encapsulation film of the present application can comprise a metal layer as the base film. Unlike the release film, the base film can not peel off. The metal layer can have, for example, a thickness range of 3 μm to 500 μm, 10 μm to 450 μm, 20 μm to 400 μm, 30 μm to 350 μm, or 40 μm to 200 μm. In the metal layer, a metal layer can be disposed on a thin metal foil or a polymer base layer. As the polymer base layer is located on the side opposite to the side where the above-described encapsulation layer is attached of the metal layer, it can serve as a protective layer. The metal layer can comprise any of a metal, a metal oxide, a metal nitride, a metal carbide, a metal oxynitride, a metal oxyboride, and a combination thereof. For example, the metal layer can comprise an alloy in which one or more metal elements or non-metal elements are added to one metal, and can comprise, for example, Invar, or stainless steel (SUS). Furthermore, in one example, the metal layer can comprise iron, chromium, copper, aluminum nickel, iron oxide, chromium oxide, silicon oxide, aluminum oxide, titanium oxide, indium oxide, tin oxide, indium tin oxide, tantalum oxide, zirconium oxide, niobium oxide and a combination thereof.

The present application also relates to an organic electronic device. The organic electronic device can be a flexible organic electronic device or a rollable organic electronic device. The organic electronic device can comprise the above-described encapsulation film. As shown in FIG. 1, an exemplary organic electronic device can also comprise a substrate (1), an organic electronic element (2) formed on the substrate and an encapsulation film (3) for encapsulating the entire surface of the organic electronic element (2). FIG. 1 is a structure in which the encapsulation film illustratively comprises an encapsulation layer (3) and a metal layer (4).

The organic electronic element present on the entire surface of the substrate region can comprise a first electrode layer and a second electrode layer, and can also comprise an organic layer present between the first and second electrode layers. The first and second electrode layers can be a hole-injection or electron-injection electrode layer commonly used in organic electronic devices. Any one of the first and second electrode layers can be formed of a hole-injection electrode layer and the other can be formed of an electron-injection electrode layer. Any one of the first and second electrode layers can be formed of a transparent electrode layer and the other can be formed of a reflective electrode layer.

An organic layer is present between the first and second electrode layers. The organic layer can comprise at least two light emitting units. In such a structure, the light generated by the light emitting unit can be emitted to the transparent electrode layer side through a process reflected by the reflective electrode layer, and the like.

The specific structure of the organic layer is not particularly limited. In this field, various materials for forming a hole or electron injecting electrode layer and an organic layer, for example, a light emitting unit, an electron injecting or transporting layer, a hole injecting or transporting layer, and forming methods thereof are known, and all the above methods can be applied to manufacture the organic electronic device.

In addition, the organic electronic element of the present application can comprise a protective layer. The protective layer can prevent damage to the electrode, which can be composed of typical materials in this technical field, and for example, an inorganic layer deposited with SiNx or $Al_2O_3$, and the like, as an inorganic material, and an organic layer can be alternately laminated.

The present application also relates to a method for preparing the organic electronic device.

The production method can comprise a step of applying the above-described encapsulation film on a substrate on which an organic electronic element is formed so as to cover the organic electronic element. The encapsulation film can be cured before or after covering the organic electronic element.

The term "curing" herein can mean that the encapsulation composition of the present invention forms a cross-linked structure through heating or UV irradiation processes, and the like to be produced in the form of a pressure-sensitive adhesive or an adhesive.

The production method of the present application can form an organic electronic element by forming an electrode on a polymer film used as a substrate with a method such as vacuum deposition or sputtering, forming a luminescent organic material layer composed of, for example, a hole transporting layer, a light emitting layer and an electron transporting layer, and the like on the electrode and then further forming an electrode layer on the entire surface. Subsequently, in the substrate performed by the above process, the above-described encapsulation film is placed on the surface on which the element is formed, so that the entire surface of the element is encapsulated. Subsequently, the encapsulation film can be heated using a laminator or the like and compressed in a state where fluidity is imparted.

Although one example of the method for manufacturing the organic electronic device has been mentioned above, the organic electronic device can be manufactured in other ways as well. For example, the device is manufactured in the same manner as described above, but the order or conditions of the process can be changed.

Advantageous Effects

The present application provides an encapsulation film having excellent resilience without causing plastic deformation, while having flexible and rollable characteristics, as well as implementing excellent moisture barrier characteristics, and an organic electronic device comprising the same.

BRIEF DESCRIPTION OF DRAWINGS

FIG. 1 is a cross-sectional view showing an exemplary organic electronic device.

EXPLANATION OF REFERENCE NUMERALS

1: substrate
2: organic electronic element
3: encapsulation layer or encapsulation film
4: metal layer

DETAILED DESCRIPTION

Hereinafter, the present invention will be described in more detail through examples according to the present invention and comparative examples not according to the present invention, but the scope of the present invention is not limited by the following examples.

Example 1

A styrene-butadiene-styrene copolymer (SBS, Mw: 100,000 g/mol, LG Chem) as a block copolymer, a urethane acrylate oligomer (CN9021NS, Mw: 5000 g/mol, Satomer) as a multifunctional oligomer and trimethyrolpropane triacrylate (TMPTA, Aldrich) as a reactive monomer were each introduced to a reaction vessel at a weight ratio of 60:30:10 (SBS: CN9021NS: TMPTA), and 5 parts by weight of 1-hydroxy-cyclohexylphenyl ketone (Irgarcure 184, Ciba) as a photoinitiator, 50 parts by weight of CaO (Aldrich) as a moisture adsorbent and 0.5 parts by weight of a silane coupling agent (KBM-5103, Shin-Etsu) were introduced thereto, and then the mixture was diluted with toluene to a solid content of 40 wt % or so to prepare an encapsulation composition coating solution.

An encapsulation film was produced by applying the prepared solution to the release surface of the release PET and drying it in an oven at 110° C. for 3 minutes to form an encapsulation layer having a thickness of 50 μm.

Example 2

An encapsulation composition and an encapsulation film were produced in the same method as in Example 1, except that a styrene-butadiene-styrene copolymer (SBS, Mw: 100,000 g/mol, LG Chem) as a block copolymer, a urethane acrylate oligomer (CN9021NS, Mw: 5000 g/mol, Satomer) as a multifunctional oligomer and trimethyrolpropane triacrylate (TMPTA, Aldrich) were each introduced to a reaction vessel at a weight ratio of 50:25:25 (SBS: CN9021NS: TMPTA).

Example 3

An encapsulation composition and an encapsulation film were produced in the same method as in Example 1, except that a styrene-butadiene-styrene copolymer (SBS, Mw: 100,000 g/mol, LG Chem) as a block copolymer, a urethane acrylate oligomer (CN9021NS, Mw: 5000 g/mol, Satomer) as a multifunctional oligomer and lauryl acrylate (LA, Aldrich) as a reactive monomer were introduced to a reaction vessel at a weight ratio of 60:35:5 (SBS: CN9021NS: LA).

Comparative Example 1

An encapsulation composition and an encapsulation film were produced in the same method as in Example 1, except that a urethane acrylate oligomer (CN1073NS, Mw: 3000 g/mol) as a monofunctional oligomer was used instead of CN9021NS as the multifunctional oligomer.

Comparative Example 2

An encapsulation composition and an encapsulation film were produced in the same method as in Example 1, except that a random copolymer isobutylene-isoprene rubber (IIR, Exxon) was used instead of the styrene-butadiene-styrene block copolymer.

Comparative Example 3

An encapsulation composition and an encapsulation film were produced in the same method as in Example 1, except that a styrene-butadiene-styrene copolymer (SBS, Mw: 100,000 g/mol, LG Chem) as a block copolymer, a urethane acrylate oligomer (CN9021NS, Mw: 5000 g/mol, Satomer) as a multifunctional oligomer and trimethyrolpropane triacrylate (TMPTA, Aldrich) as a reactive monomer were each introduced to a reaction vessel at a weight ratio of 20:60:20 (SBS: CN9021NS: TMPTA).

Physical properties of the produced encapsulation films were evaluated as follows. Evaluation of the physical properties proceeded after curing the encapsulation film, where in the case of thermal curing, the curing was performed at 100° C. for 1 hour or more, and in the case of UV curing, ultraviolet rays of 1 J/cm$^2$ or more were irradiated.

Experimental Example 1—Restoration Characteristics

After the encapsulation films produced in Examples and Comparative Examples were stretched 200% (2 times the existing length) in the longitudinal direction under conditions of a temperature of 25° C. and 60% relative humidity and left for 24 hours, the degree of restoration at the time of removing the stretched force and measuring the length after 1 hour was evaluated.

Experimental Example 2—Heat Resistance Durability

The films produced in Examples and Comparative Examples were laminated to soda lime glass, and samples were prepared by vacuum bonding soda lime glass together. The samples were placed in an oven at 85° C. for 1000 hours to observe changes. It was observed whether air bubbles were generated between the glass substrate and the encapsulation film. When seen with the naked eye, it was indicated as X in the case where any bubble occurred between the glass substrate and the encapsulation film, and it was indicated as O in the case where no bubble occurred.

Experimental Example 3—Moisture-Heat Resistance Durability

The samples prepared in Experimental Example 2 were left under 85° C. and 85% relative humidity for 1000 hours to observe changes.

It was observed whether lifting occurred at the interface between the glass substrate and the encapsulation film.

When seen with the naked eye, it was indicated as X in the case where any lifting occurred at the interface between the glass substrate and the encapsulation film, and it was indicated as O in the case where no lifting occurred.

Experimental Example 4—Moisture Barrier Performance

Calcium was deposited on a glass substrate having a size of 100 mm×100 mm to a size of 5 mm×5 mm and a thickness of 100 nm, and encapsulation films of Examples and Comparative Examples were applied to cover all of the calcium. After bonding with a cover glass having a size of 100 mm×100 mm on the film, it was cured under the curing conditions as described above. The resulting specimens were observed in a constant temperature and humidity chamber at 85° C. and 85% relative humidity, and it was observed whether the calcium becomes transparent by an oxidation reaction due to moisture penetration. The time that it took for moisture to penetrate 3 mm (to become transparent) was measured.

TABLE 1

|  |  | Restoration Characteristics (%) | Heat Resistance Durability | Moisture-Heat Resistance Durability | Moisture Barrier Performance (hour) |
|---|---|---|---|---|---|
| Example | 1 | 105 | ○ | ○ | 1800 |
|  | 2 | 103 | ○ | ○ | 1700 |
|  | 3 | 108 | ○ | ○ | 1500 |
| Comparative Example | 1 | 125 | X | ○ | 1300 |
|  | 2 | 230 | ○ | ○ | 1400 |
|  | 3 | 118 | X | X | Lifting |

The invention claimed is:

1. An encapsulation film comprising an encapsulation composition,
    wherein the encapsulation composition comprises:
    a block copolymer having a first block derived from a monomer having a glass transition temperature of 0° C. or higher, and
    a multifunctional oligomer having a weight average molecular weight in a range of 1200 g/mol to 50,000 g/mol,
    wherein the block copolymer and the multifunctional oligomer are included in the encapsulation composition in amounts of 30 to 90 parts by weight and 5 to 48 parts by weight, respectively,
    wherein after the encapsulation film is stretched 200% (2 times the original length) in the longitudinal direction under conditions of a temperature of 25° C. and 60% relative humidity and left for 24 hours, the degree of restoration at the time of removing the stretched force and measuring the length after 1 hour is within 110% of the original length.

2. The encapsulation film according to claim 1, wherein the block copolymer further comprises a second block, and the second block has a glass transition temperature lower than that of the first block.

3. The encapsulation film according to claim 2, wherein the second block is derived from a monomer having a glass transition temperature of less than 0° C.

4. The encapsulation film according to claim 1, wherein the first block is derived from a monomer having a glass transition temperature of 50° C. to 300° C.

5. The encapsulation film according to claim 1, wherein the block copolymer comprises at least one or more unsaturated groups in the molecular structure.

6. The encapsulation film according to claim 1, wherein the block copolymer has a weight average molecular weight in a range of 10,000 g/mol to 2,000,000 g/mol.

7. The encapsulation film according to claim 1, wherein the multifunctional oligomer comprises two or more active energy ray polymerizable functional groups.

8. The encapsulation film according to claim 1, wherein the multifunctional oligomer comprises an acrylic compound or a vinyl compound.

9. The encapsulation film according to claim 1, wherein the encapsulation composition further comprises a reactive monomer.

10. The encapsulation film according to claim 9, wherein the reactive monomer comprises one or more active energy ray polymerizable functional groups.

11. The encapsulation film according to claim 9, wherein the reactive monomer comprises a monofunctional or multifunctional acrylic compound or a monofunctional or multifunctional vinyl compound.

12. The encapsulation film according to claim 9, wherein the reactive monomer is included in the encapsulation composition in an amount of 1 to 40 parts by weight.

13. The encapsulation film according to claim 1, wherein the encapsulation composition further comprises a moisture adsorbent.

14. The encapsulation film according to claim 13, wherein the moisture adsorbent is included in the encapsulation composition in a range of 5 to 200 parts by weight relative to 100 parts by weight of the block copolymer.

15. The encapsulation film according to claim 1, wherein the encapsulation composition further comprises a curing agent or an initiator.

16. The encapsulation film according to claim 1, wherein the encapsulation composition further comprises a silane coupling agent.

17. The encapsulation film according to claim 1, comprising an encapsulation layer, wherein the encapsulation layer has a single layer or a multi-layer structure of two or more layers.

18. An organic electronic device, comprising:
    a substrate;
    an organic electronic element formed on the substrate; and
    the encapsulation film of claim 1 encapsulating the entire surface of the organic electronic element.

19. A method for preparing an organic electronic device, comprising:
    a step of applying the encapsulation film of claim 1 on a substrate on which an organic electronic element is formed so as to cover the organic electronic element.

* * * * *